United States Patent [19]

Meyer et al.

[11] 4,433,044
[45] Feb. 21, 1984

[54] DRY DEVELOPABLE POSITIVE PHOTORESISTS

[75] Inventors: Wolfgang H. Meyer, Urdorf; Bernard J. Curtis, Gattikon, both of Switzerland

[73] Assignee: RCA Corporation, New York, N.Y.

[21] Appl. No.: 441,682

[22] Filed: Nov. 15, 1982

[51] Int. Cl.³ .......................... G03F 7/26; G03C 1/76; C08F 30/08

[52] U.S. Cl. .................................. 430/271; 430/270; 430/313; 430/323; 430/326; 430/327; 156/643; 526/279

[58] Field of Search ............... 430/270, 271, 299, 313, 430/323, 326, 327; 204/159.13; 526/279; 156/643

[56] References Cited

U.S. PATENT DOCUMENTS 3,558,311  1/1971  Delzenne et al. .................... 430/270

OTHER PUBLICATIONS

Petrov et al., in Dokl. Akad. Nauk. S.S.S.R. 100, pp. 929–932 (1955) Chemical Abstract.
Taylor et al., *J. Electrochem. Soc.*, 127, No. 12, pp. 2665–2674 (1980).
Taylor et al., *J. Electrochem. Soc.*, 128, No. 2, pp. 361–366 (1981).
Hughes et al., *Polymer Eng. & Sci.*, 20, No. 16, pp. 1093–1096 (1980).
Yoshikawa et al., *Appl. Phys. Lett.*, 36, No. 1, pp. 107–109 (1980).
Chang et al., *Appl. Phys. Lett.*, 33, No. 10, pp. 892–895 (1978).

*Primary Examiner*—John E. Kittle
*Assistant Examiner*—Cynthia Hamilton
*Attorney, Agent, or Firm*—Birgit E. Morris; R. Hain Swope

[57] ABSTRACT

Novel copolymers comprising a compound containing an acrylate moiety and a silicon-containing oxime ester of methacrylic acid having the formula

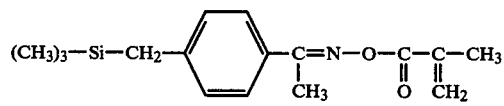

are positive resist recording media which can be dry developed.

10 Claims, No Drawings

DRY DEVELOPABLE POSITIVE PHOTORESISTS

This invention pertains to novel copolymers useful as positive resist recording media in the manufacture of electronic devices including microelectronic circuits. The subject copolymers are advantageous in that they can be developed without the use of solvents.

BACKGROUND OF THE INVENTION

The current trend in the semiconductor industry is to use dry etching techniques in the fabrication of electronic devices and structures. This is because conventional wet development utilizing solvents does not provide the anisotropic development which is necessary to achieve optimal dimensional control of microstructures. It follows that an anisotropic etch of a layer of material can take place only if the resist layer thereover is developed anisotropically. The most advantageous way of accomplishing this would be to dry develop the pattern in the resist, preferably in the same etching apparatus utilized to etch the underlying layer.

Reports of dry developable resists have only recently begun to appear in the literature. Resists developable by x-ray have been described which are both positive and negative working. To date, however, the only dry developable photoresists reported in the literature are negative acting. This is so regardless of whether the resists are organic or inorganic, such as silver sensitized antimony sulfide or germanium selenide. Because positive-working resists are preferred for the ultrafine dimensions of the microstructures, there exists a definite need for positive acting resist materials which are dry developable by, e.g. plasma etching. Such resists are provided in accordance with this invention.

SUMMARY OF THE INVENTION

In accordance with this invention, there are provided novel copolymers of acrylic acid, methacrylic acid, or their esters, and a silicon-containing oxime ester of methacrylic acid, which are useful as positive resists.

DETAILED DESCRIPTION OF THE INVENTION

The novel copolymers of this invention are copolymers of certain compounds containing an acrylate moiety and a silicon-containing oxime ester of methacrylic acid. In terms of mole percentage, the copolymers of this invention contain the acrylate moiety-containing compound and the oxime in a molar ratio of from about 1:10 to 10:1, preferably from about 1:1 to about 3:1.

In accordance with this invention, the monomers containing an acrylate moiety, i.e. the chemical group represented by the formula $$CH_2=C-C-O-$$
         |  ||
         R  O wherein R is hydrogen or methyl include acrylic acid, methacrylic acid and their esters. Preferred esters are alkyl esters, particularly lower alkyl esters wherein the group contains from 1 to 6 carbon atoms such as, for example, methyl methacrylate, ethyl methacrylate and the like.

The silicon-containing oxime ester of methacrylic acid, referred to hereinafter by the designation "SOMA", is 4-(trimethylsilylmethylene)acetophenoneoxime methacrylate, having the structural formula

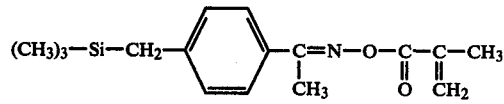

SOMA, which is a novel compound, may be prepared by reacting methacryloyl chloride with 4-(trimethylsilylmethylene)acetophenoneoxime in the cold in the presence of a base, preferably an organic base.

The starting material utilized to prepare SOMA, 4-(trimethylsilylmethylene)acetophenoneoxime, and its preparation are disclosed by Petrov et al. Dokl. Akad. Nauk. S.S.S.R., 100, pp. 929–932 (1955). This compound is prepared conventionally from the corresponding acetophenone which is, in turn, prepared by conventional acylation from trimethylbenzylsilane according to the reaction

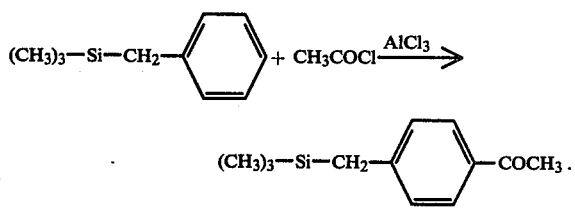

The novel copolymers of this invention can be prepared by free radical polymerization in the presence of a conventional polymerization initiator such as dibenzoylperoxide, t-butylhydroperoxide or the like. The molecular weight of the copolymer can be controlled by the amount of the polymerization initiator being present, with increased amounts giving lower molecular weights and vice versa.

In order to apply the novel copolymers of this invention to a substrate, they are initially dissolved in a suitable solvent. The resulting solution is then coated onto the substrate, e.g. silicon, quartz, glass, sapphire and the like, in a conventional manner, e.g. by casting, spraying, spin coating and the like. The solution usually contains from about 5 to about 15, preferably about 10 percent by weight of the copolymer. Suitable solvents have boiling points below the decomposition point of the copolymer, thus permitting ready removal by, e.g. conventional heating or vacuum drying. Examples of suitable solvents include 2-methoxyethylacetate and cyclopentanone.

Photoresist layers formed from the subject novel copolymers can have thicknesses varying from about 1000 angstroms to about one micron depending on the requirements of the application. The resist layer is dried to remove the solvent, and then selectively irradiated with ultraviolet radiation by using, e.g. a suitable mask. The subject copolymers are deep UV resists, i.e. they are irradiated with an exposure source having a wavelength in the deep UV range, i.e. from 250 to 300 nm. This may be carried out with a low pressure mercury vapor lamp, a xenon arc lamp or other conventional equipment. The resist layer may be flood exposed or scan exposed with, e.g. a deep ultraviolet laser.

After irradiation, the resist layer is baked at a temperature below the thermal decomposition point of the copolymer. Generally, the resist layer is baked at a temperature between about 100° and about 150° C., preferably at 140° C., for from about 3 to 30 minutes, preferably about 15 minutes. The baking step increases the selectivity of the irradiated and unirradiated portions to oxygen plasma etch. It is preferred that the baking step be carried out under vacuum, suitably at a pressure of about $10^{-1}$ torr. The baking step causes a substantial reduction, generally up to about 40 percent, in the thickness of the irradiated portion of the subject resist films. The amount of the reduction in thickness of the film will vary proportionately with the content of SOMA in the copolymer and/or the exposure dose.

The irradiated portions of the subject photoresist layer are then removed, i.e. developed, by oxygen plasma etching using conventional equipment. Typically, the resist layer is rf sputter etched at about 0.1 to about 1.0, preferably about 0.3 watts $cm^{-2}$ of plasma power and, from about 20 to about 200, preferably about 50 mtorr of oxygen pressure for from about 10 to about 100 minutes, preferably for about 30 minutes.

The removal rates of the subject copolymers in an oxygen plasma are substantially lower than those of known polymers, such as polymethylmethacrylate. This is undoubtedly due to their silicon content. Under identical conditions, polymethylmethacrylate will be etched in an oxygen plasma at a rate about twenty times faster than the subject copolymers.

Because resist films of the subject copolymers have high extinction coefficients and low removal rates, they are ideally suited for application in a bilevel resist system. In such a system, the subject copolymer is utilized as the top or pattern layer on a more easily etchable material such as a plastic. A particularly preferred material for the underlying layer is a polyimide such as is conventionally used as a dielectric in electronics applications. The layer of plastic is further advantageous in that it serves as a planarizing layer over the substrate. It will be readily appreciated that the use of such a layer in combination with the novel resist copolymer of this invention can provide an anisotropic etch of the underlying substrate.

The thickness of the underlying layer of a plastic such as a polyimide in a bilevel resist system incorporating the subject copolymers will depend on the relative removal rate thereof with reference to the top layer. The depth of the profile which can be etched into the sublayer or the underlying substrate will depend on the relative removal rates of the irradiated portion of the resist film of the subject copolymer, the nonirradiated portion thereof and the sublayer. Obviously, the greater these differences, the higher the selectivity of the etch and the deeper the profile. For example, utilizing a patterned resist layer of the subject copolymer initially 3400 angstroms thick, which has been irradiated with a total dose of 2500 mJ/cm$^2$ at 254 nm, an underlying layer of polyimide can be plasma etched to a depth of 4.2 micrometers before the resist layer has disappeared from the surface. The thickness of the layers of the subject copolymers and underlying plastic required to accomplish a particular objective are considered to be within the skill of the art.

The subject copolymers are advantageous in that they can be utilized as resist materials without the hazards and loss of resolution often inherent in the development of resist with solvents. Of even greater advantage is the fact that it is possible to develop the subject resist films, pattern transfer into a sublayer with an oxygen plasma and dry etch the underlying substrate all in the same reactor. It may be necessary, of course, to change the plasma depending on the nature and relative etchability of the underlying substrate in oxygen.

The following Examples further illustrate this invention, it being understood that the invention is in no way intended to be limited to the details described therein. In the Examples, all temperatures are in degrees Celsius.

EXAMPLE 1

Part A: Preparation of 4-(trimethylsilylmethylene)acetophenoneoxime methacrylate A solution of 11 g. of methacryloylchloride in 100 ml of diethylether was added dropwise at 0° with stirring to a solution of 24 g. of 4-(trimethylsilylmethylene)acetophenoneoxime and 33 ml. of triethylamine in 50 ml of diethylether. The solution was maintained with stirring for an additional three hours, after which the product was precipitated with methanol.

The product was recrystallized from ethanol to yield 17.6 g. of 4-(trimethylsilylmethylene)acetophenoneoxime methacrylate as white needlelike crystals.

Part B: Preparation of 4:3 Copolymer

A copolymer was formed from 6.2 g of 4-(trimethylsilylmethylene)acetophenoneoxime methacrylate, as formed in Part A, and 5 g methylmethacrylate in 88 g. of toluene utilizing 0.02 g of dibenzoylperoxide as an initiator. The reaction was carried out at 70° under a nitrogen blanket for 18 hours. The product was precipitated with methanol.

Part C: Preparation of 3:1 Copolymer

In a like manner, 7.25 g. of 4-(trimethylsilylmethylene)acetophenoneoxime methacrylate and 10 g. of methyl methacrylate were copolymerized in 82 g. of toluene with 0.06 g. of dibenzoylperoxide. The reaction was allowed to proceed for 50 hours when the product was precipitated with methanol and recovered.

Part D: Use as a Resist

The copolymers obtained in Parts B and C were spin-coated, respectively, onto quartz substrates from 10 percent solutions in 2-methoxyethylacetate. For the copolymer of Part B, a 60 second spin time at 4000 rpm produced a film 3400 angstroms thick. For the copolymer of Part C, a 60 second spin-time at 5000 rpm produced a film 3100 angstroms thick.

Samples of the films were irradiated for various lengths of time with a low-pressure mercury lamp at 254 nm through a grating mask of 300 micron lines and spaces. All samples were than baked at 140° at $10^{-1}$ torr for 15 minutes and determinations were made of film thickness remaining in the irradiated portions of the film. The film remaining on most samples given a dosage of from 1000 to 4500 millijoules/cm$^2$ was between 60 and 80 percent. The minimum amount of film remaining under any of the conditions tested was about 56 percent.

The substrates were placed on a conventional rf powered plasma chamber. The chamber was evacuated to its ultimate pressure and then backfilled with ultrapure oxygen to a pressure of 20 mtorr. After 5 minutes at 0.3 watt per cm$^2$ plasma power, the irradiated portions of the film were removed, thus exposing the underlying substrate.

EXAMPLE 2

The copolymer of Example 1, Part B was spin-coated to a thickness of 3400 angstroms over a 5.1 micro thick layer of polyimide (Ciba-Geigy XU-218) and exposed to various doses of irradiation as in Example 1, Part D. After a baking in a vacuum oven at 140° for 15 minutes, the samples of this bilevel resist system were etched in an oxygen plasma as described in Example 1, Part D. After 30 minutes, the line grating depth in the polyimide of the various exposures was determined by both Dektak profilometer and scanning electron microscope.

It was found that the depth of the pattern in the polyimide correlated with amount of the irradiation received by the resist film. A sample of resist film receiving 250 mJ/cm$^2$ irradiation, after plasma development, showed 2.1 micron deep lines in the polyimide layer. Samples receiving 2500 mJ/cm$^2$ showed 4.2 micron deep lines.

Comparative Example

A layer of a conventional resist material, polymethylmethacrylate, was spin-coated onto a substrate to a thickness of 3500 angstroms. This layer was dried and baked. The polymethylmethacrylate layer was irradiated with a 254 nm low pressure mercury lamp as in Example 1, Part D. A dosage level twice the maximum administered in Example 1 failed to produce any discernible change in the thickness of the film.

We claim:

1. A method of forming a patterned layer on a substrate comprising:

(a) coating the substrate with a composition comprising the copolymer of a silicon-containing oxime ester of methacrylic acid represented by the formula

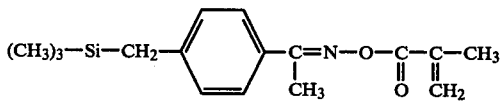

and an acrylate-containing monomer selected from the group consisting of acrylic acid, methacrylic acid and their esters, and a suitable solvent therefor;

(b) drying the coating to form a resist film;
(c) irradiating selected portions of the film with a source of ultraviolet radiation;
(d) baking the film under vacuum; and
(e) dry developing the film to remove the irradiated portions thereof by etching in an oxygen plasma.

2. A method in accordance with claim 1, wherein said monomer is methyl methacrylate 3. A method in accordance with claim 1, wherein said ultraviolet radiation has a wavelength of from about 250 to about 300 nm.

4. A method in accordance with claim 1, wherein etching is continued after the irradiated portions of said film have been removed whereby a pattern is formed in the substrate.

5. A method in accordance with claim 1, additionally including the step of forming a layer of a dielectric polyimide on the substrate prior to the coating thereof with said composition.

6. A method in accordance with claim 5 wherein said development is continued until portions of said layer of polyimide have been removed.

7. A method in accordance with claim 6, wherein etching is continued until portions of the substrate underlying the layer of polyimide have been removed.

8. A recording medium comprising a substrate having imposed thereon a positive photoresist comprising a copolymer of a silicon-containing oxime ester of methacrylic acid represented by the formula

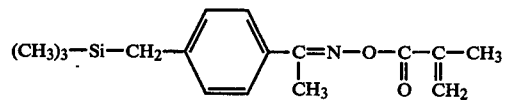

and an acrylate-containing monomer selected from the group consisting of acrylic acid, methacrylic acid and their esters.

9. A recording medium in accordance with claim 8, wherein said photoresist comprises a first layer of a dielectric polyimide on the substrate and a second layer of said copolymer and imposed on said dielectric layer.

10. A copolymer of a silicon-containing oxime ester of methacrylic acid represented by the formula

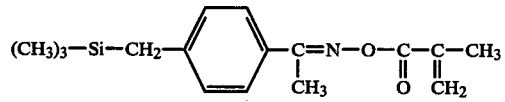

and an acrylate-containing monomer selected from the group consisting of acrylic acid, methacrylic acid and their esters.

* * * * *